United States Patent
Lee et al.

(10) Patent No.: US 6,576,528 B1
(45) Date of Patent: Jun. 10, 2003

(54) CAPACITOR FOR SEMICONDUCTOR MEMORY DEVICE AND METHOD OF MANUFACTURING THE SAME

(75) Inventors: Kee Jeung Lee, Seoul (KR); Dong Jun Kim, Kyoungki-do (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 0 days.

(21) Appl. No.: 09/607,130

(22) Filed: Jun. 28, 2000

(30) Foreign Application Priority Data

Jun. 29, 1999  (KR) .............................. 99-25465

(51) Int. Cl.[7] .............................................. H01L 21/20
(52) U.S. Cl. ...................... 438/398; 438/396; 438/240; 438/681; 438/685; 438/790
(58) Field of Search ................. 438/398, 240, 438/785, 790, 396, 608, 771, 393, 648, 681, 685

(56) References Cited

U.S. PATENT DOCUMENTS

| 4,130,694 | A |   | 12/1978 | Glass et al. |
|---|---|---|---|---|
| 5,352,623 | A | * | 10/1994 | Kamiyama ................. 438/396 |
| 5,452,178 | A |   | 9/1995 | Emesh et al. |
| 5,631,188 | A |   | 5/1997 | Chang et al. |
| 5,677,015 | A | * | 10/1997 | Hasegawa ................... 427/576 |
| 5,741,721 | A |   | 4/1998 | Stevens |
| 5,753,945 | A |   | 5/1998 | Chivukula et al. |
| 5,763,300 | A |   | 6/1998 | Park et al. |
| 5,776,660 | A |   | 7/1998 | Hakey et al. |
| 5,837,576 | A |   | 11/1998 | Chen et al. |
| 5,859,760 | A |   | 1/1999 | Park et al. |
| 5,872,415 | A |   | 2/1999 | Dreifus et al. |
| 5,910,880 | A |   | 6/1999 | DeBoer et al. |
| 5,936,831 | A |   | 8/1999 | Kola et al. |
| 5,977,582 | A |   | 11/1999 | Fleming et al. |
| 5,980,977 | A |   | 11/1999 | Deng et al. |
| 6,077,715 | A | * | 6/2000 | Chivukula et al. ............. 438/3 |
| 6,180,542 | B1 | * | 1/2002 | Hwang ....................... 438/785 |
| 6,338,995 | B1 | * | 1/2002 | Hwang et al. .............. 438/240 |

FOREIGN PATENT DOCUMENTS

| JP | 62136035 | 6/1987 |
|---|---|---|
| JP | 63038248 | 2/1988 |
| JP | 01173622 | 7/1989 |
| JP | 02226754 | 9/1990 |
| JP | 05167008 | 7/1993 |
| JP | 05335483 | 12/1993 |
| JP | 06163819 | 6/1994 |
| JP | 07014993 | 1/1995 |
| JP | 07045467 | 2/1995 |
| JP | 11191612 | 7/1999 |
| JP | 11233723 | 8/1999 |

* cited by examiner

*Primary Examiner*—Matthew Smith
*Assistant Examiner*—Igwe U. Anya
(74) *Attorney, Agent, or Firm*—Pillsbury Winthrop LLP

(57) ABSTRACT

Disclosed are a capacitor for semiconductor devices capable of increasing storage capacitance and preventing leakage current, and method of manufacturing the same. The capacitor for semiconductor memory devices according to the present invention includes: a lower electrode; a dielectric layer formed on the lower electrode; and an upper electrode formed on the upper portion of the dielectric layer, wherein the dielectric layer is a crystalline $Ta_xO_yN_z$ layer, and the total of x, y, and z in the crystalline $Ta_xO_yN_z$ layer is 1, and y is 0.3 to 0.5, and z is 0.1 to 0.3.

22 Claims, 2 Drawing Sheets

CAPACITOR FOR SEMICONDUCTOR MEMORY DEVICE AND METHOD OF MANUFACTURING THE SAME

FIELD OF THE INVENTION

The present invention relates to a capacitor for semiconductor memory device and a method of manufacturing the same, and more particularly to a capacitor for semiconductor memory device capable of increasing storage capacitance and preventing leakage current and method of manufacturing the same.

BACKGROUND OF THE INVENTION

Along with the recent progress in the semiconductor manufacturing technology, the demand for memory device has increased dramatically. Consequently, a memory device having higher capacitance per small dimension is required. Capacitance of the capacitor is increased by using an insulator having high dielectric constant or enlarging the surface area of a lower electrode. Those conventional capacitors have been made with tantalum-oxide($Ta_2O_5$) layer having a dielectric constant higher than that of nitride-oxide(NO) layer, thereby forming the lower electrode having 3-Dimensional structure.

FIG. 1 is a cross-sectional view of a capacitor in a conventional semiconductor memory device. Referring to FIG. 1, a field oxide layer 11 is also formed at a predetermined portion of the substrate 10. A gate electrode 13 including a gate insulating layer 12 at a lower portion thereof is formed by a known technique at a predetermined portion of a semiconductor substrate 10. A junction region 14 is formed on the semiconductor substrate 10 at each end of the gate electrode 13, thereby forming a MOS transistor. A first interlevel insulating layer 16 and a second interlevel insulating layer 18 are formed on the semiconductor substrate 10. A storage-node contact hole h is formed in the first and the second interlevel insulating layers 16,18 so that the junction region 14 is exposed. A cylinder type lower electrode 20 is formed by a known technology with in the storage-node contact hole h to contact the exposed junction region 14. A HSG(hemi-spherical grain) layer 21 is formed on a surface of the lower electrode 20 in order to increase the surface area of the lower substrate 20. A $Ta_2O_5$ layer 23 is formed on the surface of the HSG layer 21. At this time, the $Ta_2O_5$ layer 23 is formed as follows. First, a surface of the HSG layer 21 is cleaned before the $Ta_2O_5$ layer 23 is formed, and then the RTN(rapid thermal nitridation) process is performed ex situ thereby forming a silicon-nitride layer 22 on the HSG layer 21. Next, a first $Ta_2O_5$ layer is formed at temperature of approximately 400~450° C. with thickness of 53~57 Å. Afterward, an annealing process is performed at low temperature, and then there is formed a second $Ta_2O_5$ layer with the same thickness and by the same process as in the first $Ta_2O_5$ layer. Annealing processes at low temperature and at high temperature are continued in series thereby forming a single $Ta_2O_5$ layer 23. An upper electrode 24 is deposited on upper portions of the $Ta_2O_5$ layer 23 and the second interlevel insulating layer 18, thereby completing the formation of a capacitor.

However, the conventional capacitor according to the above method using the $Ta_2O_5$ layer as a dielectric layer has the following problems.

First, a difference in the composition rate of Ta and O results since $Ta_2O_5$ generally has unstable stoichiometry. As a result, substitutional Ta atoms, i.e. vacancy atoms, are generated in the $Ta_2O_5$ layer. Since those vacancy atoms are oxygen vacancy, leakage current result. The amount of vacancy atoms in the dielectric layer can be controlled depending on the contents and the bond strength of components in the $Ta_2O_5$ layer; however, it is difficult to eliminate them completely.

In order to stabilize the unstable stoichiometry of $Ta_2O_5$, the $Ta_2O_5$ layer is oxidized so as to remove the substitutional Ta atoms in the $Ta_2O_5$ layer. However, when the layer is oxidized, an oxide layer having low dielectric constant is formed at an interface between the $Ta_2O_5$ layer and the lower electrode or the $Ta_2O_5$ layer and the upper electrode since $Ta_2O_5$ easily oxidizes with the lower and the upper electrode made of polysilicon or TiN., thereby degrading the homogeneity of the interface.

Further, due to the reaction between an organic substance such as $Ta(OC_2H_5)_5$ used as a precursor and $O_2$ (or $N_2O$) gas as a reaction gas, impurities result, such as carbon atoms C, carbon compounds($CH_4, C_2H_4$) and $H_2O$ in the $Ta_2O_5$ layer. These impurities increase leakage current in the capacitor and degrade the dielectric characteristics of the $Ta_2O_5$ layer. Accordingly, a capacitor having a large capacitance is difficult to obtain.

Moreover, the use of the $Ta_2O_5$ layer as a dielectric layer generates extra ex-situ steps, one before formation of $Ta_2O_5$ layer and one after the cleaning step. Also, two thermal processes, at low and high temperatures, preferably is performed after the $Ta_2O_5$ layer has been formed. Therefore, forming a dielectric layer with $Ta_2O_5$ using the conventional method is cumbersome.

SUMMARY OF THE INVENTION

Accordingly, it is one object of the present invention to provide a capacitor for semiconductor device capable of obtaining a great capacitance by providing a dielectric layer having low leakage current and high dielectric constant.

Furthermore, the other object of the present invention is to provide a method of manufacturing capacitor for semiconductor device capable of simplifying its manufacturing process.

According to one aspect of the present invention, a capacitor for semiconductor memory device includes: a lower electrode; a dielectric layer formed on the lower electrode; and an upper electrode formed on the upper portion of the dielectric layer, wherein the dielectric layer is a crystalline $Ta_xO_yN_z$ layer, and the total of x, y, and z in the crystalline $Ta_xO_yN_z$ layer is 1, and y is 0.3 to 0.5, and z is 0.1 to 0.3.

In another aspect of the present invention, a method of manufacturing a capacitor on a semiconductor substrate includes the steps of: forming a lower electrode on the semiconductor substrate; depositing an amorphous $Ta_xO_yN_z$ layer as a dielectric layer on the lower electrode; crystallizing the amorphous $Ta_xO_yN_z$ layer; and forming an upper electrode on the crystalline $Ta_xO_yN_z$ layer, wherein the total of x, y and z in the $Ta_xO_yN_z$ layer is 1, and y is 0.3 to 0.5, and z is 0.1 to 0.3.

Still other aspect of the present invention, a method of manufacturing a capacitor on a semiconductor substrate includes the steps of: forming a lower electrode on the semiconductor substrate; surface-treating to prevent a natural oxide layer generation on the surface of the lower electrode; depositing an amorphous $Ta_xO_yN_z$ layer as a dielectric layer on the lower electrode; crystallizing the amorphous $Ta_xO_yN_z$ layer; and forming an upper electrode on the crystalline $Ta_xO_yN_z$ layer, wherein the total of x, y and z in the $Ta_xO_yN_z$ layer is 1, y is 0.3 to 0.5, and z is 0.1 to 0.3, and the amorphous $Ta_xO_yN_z$ layer is obtained by supplying Ta chemical vapor obtained from a precursor, $O_2$ gas and $NH_3$ gas with pressure of 0.1 to 100 Torr at temperature of 300 to 600° C. in an LPCVD chamber and by a surface chemical reaction thereof.

Herein, $O_2$ gas is supplied by 50 to 150 sccm and $NH_3$ is supplied by 30 to 70 sccm.

DETAILED DESCRIPTION OF THE PREFERRED EMBODIMENT

Figure 1:
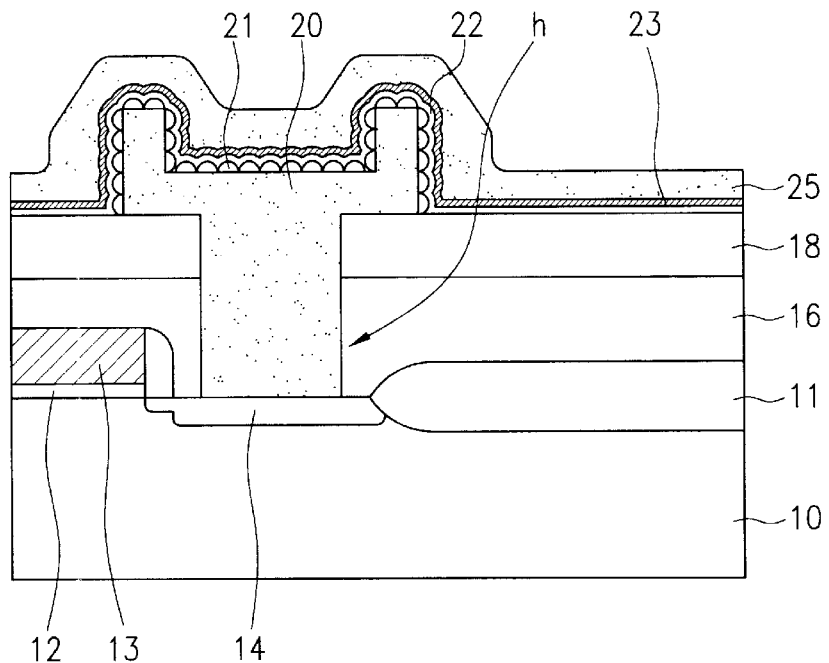
FIG. 1 is a cross-sectional view for showing a conventional capacitor on a semiconductor device.
Figure 2A:
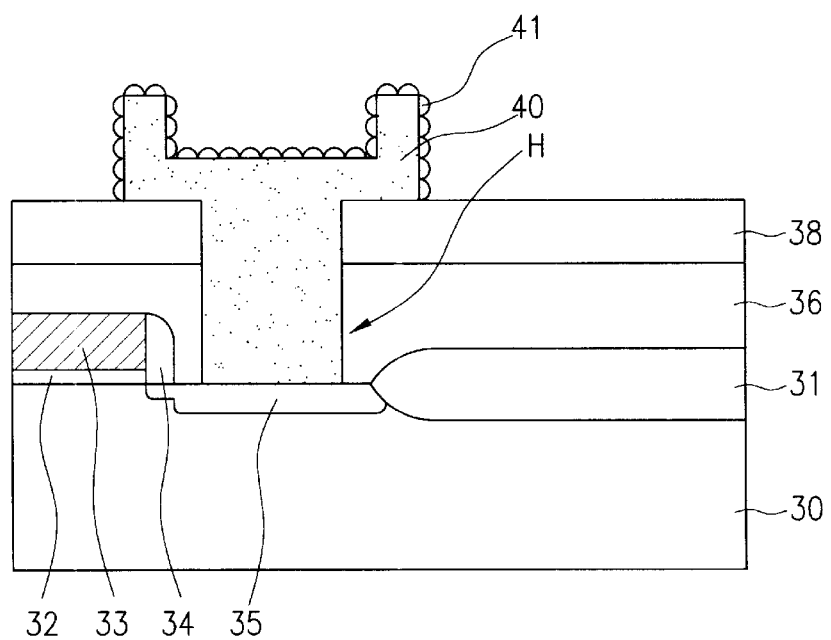
FIGS. 2A to 2C are cross-sectional views for illustrating a capacitor for a semiconductor device according to the embodiment of the present invention.

Referring to FIG. 2A, a field oxide layer 31 is formed on a selected portion of a semiconductor substrate 30 having a selected conductivity by a known method. A gate electrode 33 having a gate insulating layer 32 at a lower portion thereof is formed on a selected portion of the semiconductor substrate 30, and a spacer 34 is formed at both side-walls of the gate electrode 33 by a known method. A junction region 35 is formed on the semiconductor substrate 30 of both sides of the gate electrode 33, thereby forming a MOS transistor. A first interlevel insulating layer 36 and a second interlevel layer 38 are formed on the semiconductor substrate 30 in which the MOS transistor is formed. Afterward, the second and the first interlevel insulating layers 38,36 are patterned to expose a selected portion of the junction region 35, thereby forming a storage node contact hole H. A lower electrode 40 is formed to be in contact with the exposed junction region 35. At this time, the lower electrode of the present embodiment is formed as one of the various types such as stack, cylinder. A HSG layer 41 is formed on the lower electrode 40 by a known method so that the surface area of the lower electrode 40 is increased. Afterwards, the lower electrode 40 and the second interlevel insulating layer 38 are cleaned using HF vapor, HF solution or a compound containing HF to prevent the generation of a low dielectric natural oxide layer at the surface of the HSG layer 41, i.e. the interface between the lower electrode 40 including the HSG layer 41 and a dielectric layer(not illustrated) which will be formed later. The cleaning step may be performed h in situ or ex situ. Furthermore, the surface of the HSG layer 41 can be interface-treated by $NH_4OH$ solution or $H_2SO_4$ solution to more improve the interfacial homogeneity before or after cleaning the low dielectric natural oxide layer.

Figure 2B:
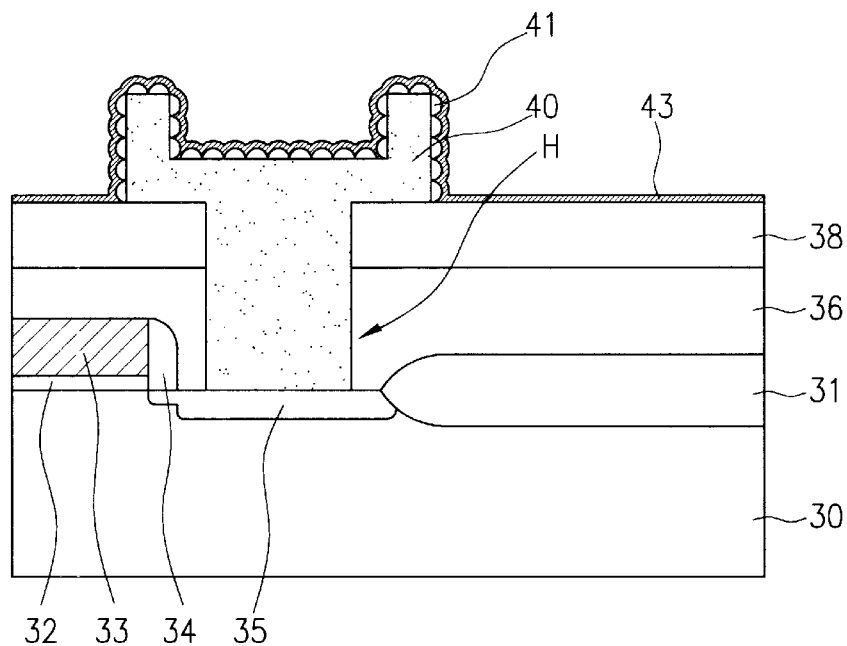

Referring to FIG. 2B, as a dielectric, an amorphous $Ta_xO_yN_z$ layer 43 is formed in situ or ex situ at an upper portion of the surface-treated lower electrode 40 with thickness of 50 to 150 Å. Here, the total of x, y, and z in the amorphous $Ta_xO_yN_z$ layer 43 is 1, y is 0.3 to 0.5, preferably 0.4, and z is 0.1 to 0.3, preferably 0.2. The amorphous $Ta_xO_yN_z$ layer 43 is formed by a chemical reaction of Ta chemical vapor obtained from a precursor, $O_2$ gas and $NH_3$ gas in a low pressure chemical vapor deposition(LPCVD) chamber. Here, when depositing the $Ta_xO_yN_z$ layer 43, a chemical reaction is occurred only on the wafer surface under a condition that a gas phase reaction within a chamber is extremely restrained to minimize particle generation in the inside thereof. At this time, it is desirable that the temperature in the LPCVD chamber is 300 to 600° C. with pressure of 0.1 to 10 Torr. And, an organic metal containing tantalum, for example $Ta(OC_2H_5)_5$(tantalum ethylate), and $Ta(N(CH_3)_2)_5$(penta-dimethyl-amino-tantalum), is used as the precursor. Here, the precursor such as $Ta(OC_2H_5)_5$, and $Ta(N(CH_3)_2)_5$ is in liquid state, as known in the art, so the precursor is preferably supplied in the LPCVD chamber after it has been converted to vapor state. That is, a selected amount of the precursor in liquid state is flowed using a flow controller such as MFC(mass flow controller) and then evaporated in an evaporizer or evaporation tube including an orifice or nozzle, thereby generating a Ta chemical vapor. At this time, the precursor is preferably supplied into the evaporizer or the evaporation tube at a rate of 100 to 200 mg/min. And, the temperature of the evaporizer and a conduit coupled to the chamber, a flow path of the Ta vapor is maintained preferably at temperature of 150~200° C. to prevent condensation of the Ta chemical vapor. In addition, $O_2$ gas is injected by 50~150 sccm to satisfy y as to 0.3~0.5, and $NH_3$ gas is injected by 30~70 sccm to satisfy z as to 0.1~0.3.

Figure 2C:
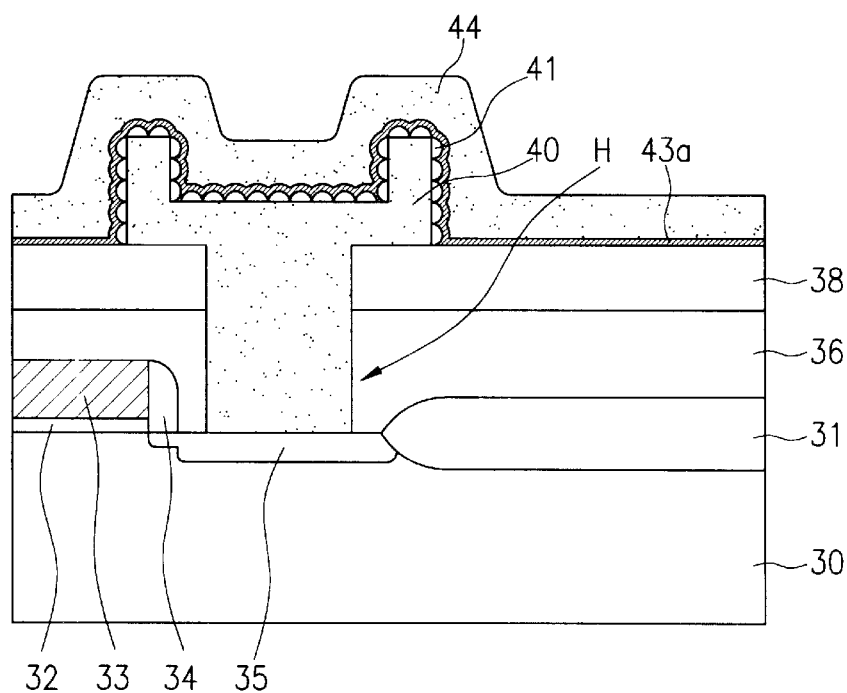

Afterward, as shown in FIG. 2C, the amorphous $Ta_xO_yN_z$ layer 43 is crystallized by an annealing step for obtaining further stable state. At this time, the crystallizing step is performed as an RTP in situ or ex situ in a chamber of $N_2O$ or $O_2$ atmosphere with temperature of 600~950° C. for 30 seconds~10 minutes. According to this crystallizing step, the amorphous $Ta_xO_yN_z$ layer 43 becomes a crystalline $Ta_xO_yN_z$ layer 43a and then impurities therein are removed, thereby improving dielectric constant of the $Ta_xO_yN_z$ layer 43a. And, the amorphous $Ta_xO_yN_z$ layer 43 can be crystallized in a furnace having $N_2O$, $O_2$ or $N_2$ gas atmosphere at temperature of 600~950° C. Moreover, the crystallizing step can be performed by the RTP or in a furnace under nitrogen containing gas, for example $NH_3$, $N_2$ or $N_2/H_2$ gas atmosphere and at temperature of 600~950° C. At this time, when an annealing step is performed under nitrogen atmosphere, the amorphous $Ta_xO_yN_z$ layer 43 is crystallized and impurities therein are all diffused. As a result, a reaction between an upper electrode and the $Ta_xO_yN_z$ layer 43a is prevented due to the surface nitrification. Afterward, a conduction barrier 44 is formed on an upper portion of the crystallized $Ta_xO_yN_z$ layer 43a and is formed of a TiN layer. The upper electrode 45 is formed of a doped polysilicon layer and is formed on an upper portion of the conduction barrier layer 44.

Furthermore, the surface treatment of a lower electrode before depositing an amorphous $Ta_xO_yN_z$ layer, can be replaced with a plasma $NH_3$ gas annealing process or the RTN process.

As described above, advantages using $Ta_xO_yN_z$ layer(x+y+z=1, 0.3□y□0.5, 0.1□z□0.3) as a dielectric are as follows.

Since the $Ta_xO_yN_z$ layer has a high dielectric constant of 25~30 and a stable Ta—O—N structure, also the dielectric property thereof is superior to that of the NO layer. Moreover, the $Ta_xO_yN_z$ layer has more stable stoichiometry than that of the $Ta_2O_5$ layer. Therefore, the $Ta_xO_yN_z$ layer 43 has a superior tolerance against external electric impacts and high breakdown voltage and very low leakage current.

In addition, since the substitutional Ta atoms as existing in the $Ta_2O_5$ layer are not exist inside the $Ta_xO_yN_z$ layer, an extra oxidation process may be omitted. Moreover, since the $Ta_xO_yN_z$ layer has very low oxidation reactivity, oxidation with the lower electrodes 40,41 and the upper electrode 44 of the capacitor hardly occurs. Therefore, the thickness of the equivalent dielectric layer can be controlled to less than 30 Å thin.

And, impurities in the $Ta_xO_yN_z$ layer are removed and crystallized by performing a thermal process after forming the $Ta_xO_yN_z$ layer. Therefore, the dielectric constant of the $Ta_xO_yN_z$ layer is increased and leakage current thereof is decreased.

In the aspect of manufacturing method, the $Ta_xO_yN_z$ layer in the present embodiment is formed in a single layer, and then an annealing step for out-diffusing impurities is once performed after the $Ta_xO_yN_z$ layer is deposited. Consequently, the manufacturing process of this embodiment is simpler than that of the conventional tantalum oxide layer.

Various other modifications will be apparent to and can be readily made by those skilled in the art without departing from the scope and spirit of the present invention.

What is claimed is:

1. A method of manufacturing a capacitor of semiconductor memory devices comprising:
   providing a semiconductor substrate in which a MOS transistor is formed;
   forming, on the semiconductor substrate, an interlevel insulating layer having a contact hole exposing a selected portion of a junction region of the MOS transistor;
   forming a lower electrode on the interlevel insulating layer to contact with the exposed junction region;
   depositing an amorphous $Ta_xO_yN_z$ layer as a dielectric layer on the lower electrode;
   crystallizing the amorphous $Ta_xO_yN_z$ layer; and
   forming an upper electrode on the crystalline $Ta_xO_yN_z$ layer, wherein the total of x, y and z in the $Ta_xO_yN_z$ layer is 1, and y is 0.3 to 0.5, and z is 0.1 to 0.3;
   wherein the step of depositing the amorphous $Ta_xO_yN_z$ layer further comprises supplying reactant gases Ta chemical vapor obtained from a precursor, $O_2$ gas and $NH_3$ gas into a low pressure chemical vapor deposition chamber (LPCVD) at pressure of 0.1 to 100 Torr at temperature of 300 to 600° C. and inducing a surface chemical reaction between the reactant gases; and
   wherein the $O_2$ gas is supplied at 50 to 150 sccm and $NH_3$ is supplied at 30 to 70 sccm.

2. The method according to claim 1, wherein the Ta chemical vapor is obtained by fixing the dose of the precursor of more than 99.999% according to a flow controller and then evaporating in an evaporizer or an evaporation tube.

3. The method according to claim 2, wherein the precursor is supplied to the evaporation tube by approximately 50 to 500 mg/min.

4. The method according to claim 3, wherein the precursor is $Ta(OC_2H_5)_5$ or $Ta(N(CH_3)_2)_5$.

5. The method according to claim 2, wherein the temperature of the evaporizer or the evaporation tube is maintained at 150 to 200° C.

6. The method according to claim 1, further comprising the step of surface-treating to prevent natural oxide generation on the surface of the lower electrode, between the steps of forming the lower electrode and depositing the TaON layer.

7. The method according to claim 6, wherein the surface treatment of the lower electrode is conducted as a cleaning step using HF vapor, HF solution and a HF containing compound.

8. The method according to claim 7, further comprising an additional step of interface-treating by $NH_4OH$ solution or $H_2SO_4$ solution, before or after the cleaning process.

9. The method according to claim 1, wherein the step of crystallizing the $Ta_xO_yN_z$ layer is conducted such that a $Ta_xO_yN_z$ layer deposited resultant is annealed at an atmosphere of nitrogen containing gas at temperature of 600 to 950° C.

10. The method according to claim 1, wherein in the step of crystallizing the $Ta_xO_yN_z$ layer is conducted such that a $Ta_xO_yN_z$ layer deposited resultant is annealed at an atmosphere of oxygen containing gas at temperature of 600 to 950° C.

11. A method of manufacturing a capacitor of semiconductor memory devices, comprising:
    providing a semiconductor substrate in which a MOS transistor is formed;
    forming, on the semiconductor substrate, an interlevel insulating layer having a contact hole exposing a selected portion of a junction region of the MOS transistor;
    forming a lower electrode on the interlevel insulating layer to contact with the exposed junction region;
    surface-treating to prevent a natural oxide layer generation on the surface of the lower electrode;
    depositing an amorphous $Ta_xO_yN_z$ layer as a dielectric layer on the lower electrode;
    crystallizing the amorphous $Ta_xO_yN_z$ layer; and
    forming an upper electrode on the crystalline $Ta_xO_yN_z$ layer,
    wherein the total of x, y and z in the $Ta_xO_yN_z$ layer is 1, y is 0.3 to 0.5, and z is 0.1 to 0.3, and the amorphous $Ta_xO_yN_z$ layer is obtained by supplying Ta chemical vapor obtained from a precursor, $O_2$ gas and $NH_3$ gas with pressure of 10 to 100 Torr at temperature of 300 to 600° C. in an LPCVD chamber and by a surface chemical reaction thereof.

12. The method according to claim 11, wherein the $O_2$ gas is supplied by 50 to 150 sccm and $NH_3$ is supplied by 30 to 70 sccm.

13. The method according to claim 12, wherein the Ta chemical vapor is obtained by fixing the dose of the precursor of more than 99.999% according to a flow controller and then evaporating in an evaporizer or an evaporation tube.

14. The method according to claim 13, wherein the precursor is supplied to the evaporation tube by approximately 50 to 500 mg/min.

15. The method according to claim 14, wherein the temperature of the evaporizer or evaporation tube is maintained at 150 to 200° C.

16. The method according to claim 14, wherein the precursor is $Ta(OC_2H_5)_5$ or $Ta(N(CH_3)_2)_5$.

17. The method according to claim 11, wherein the surface treatment of the lower electrode is conducted as a cleaning step using HF vapor, HF solution and a HF containing compound.

18. The method according to claim 17, further comprising an additional step of interface-treating by $NH_4OH$ solution or $H_2SO_4$ solution, before or after the cleaning process.

19. The method according to claim 11, wherein the step of crystallizing the $Ta_xO_yN_z$ layer is conducted such that a $Ta_xO_yN_z$ layer deposited resultant is annealed at an atmosphere of nitrogen containing gas at temperature of 600 to 950° C.

20. The method according to claim 11, wherein in the step of crystallizing the $Ta_xO_yN_z$ layer is conducted such that a $Ta_xO_yN_z$ layer deposited resultant is annealed at an atmosphere of oxygen containing gas at temperature of 600 to 950° C.

21. A method of manufacturing a capacitor for a semiconductor memory device, comprising, in the following order, the steps of:

providing a semiconductor substrate in which a MOS transistor is formed;

forming, on the semiconductor substrate, an interlevel insulating layer having a contact hole exposing a selected portion of a junction region of the MOS transistor;

forming a lower electrode on the interlevel insulating layer, a portion of the lower electrode extending along the contact hole to provide electrical contact with the exposed junction region;

cleaning and treating an exposed surface of the lower electrode, the cleaning step utilizing HF and the treating step utilizing $NH_4OH$ or $H_2SO_4$;

depositing an amorphous $Ta_xO_yN_z$ layer, wherein $x+y+z=1$, $0.3 \leq y \leq 0.5$, and $0.1 \leq z \leq 0.3$, on the lower electrode by inducing a surface reaction between reactant gases comprising a Ta chemical vapor, $O_2$ gas, and $NH_3$ gas in an LPCVD chamber at a pressure of 0.1 to 10 Torr and at a temperature of 300 to 600° C.;

crystallizing the amorphous $Ta_xO_yN_z$ layer at a temperature between 600 and 950° C. under an atmosphere comprising one or more gases selected from a group consisting of $NH_3$, $N_2$, $N_2O$, $O_2$, and a mixed gas of $N_2$ and $H_2$; to form a crystalline $Ta_xO_yN_z$ layer having a nitrogen-enriched surface portion; and forming an upper electrode on the crystalline $Ta_xO_yN_z$ layer.

22. The method of manufacturing a capacitor for a semiconductor memory device according to claim 21, further comprising a step of forming a conduction barrier on the crystalline $Ta_xO_yN_z$ layer, the conduction barrier comprising TiN, wherein the step of forming the conduction barrier is completed before the step of forming the upper electrode.

* * * * *